United States Patent [19]

Kitovich et al.

[11] 4,139,909
[45] Feb. 13, 1979

[54] OPTOELECTRONIC MEMORY

[76] Inventors: Vsevolod V. Kitovich, ulitsa Mikhalkovskaya, 9, kv. 43; Valentin G. Strakhov, ulitsa Mikhalkovskaya, 9, kv. 26; Jury M. Popov, Sevastopolsky prospekt, 81, kv. 75; Anatoly F. Plotnikov, ulitsa Garibaldi, 21, kv. 68; Vladimir N. Seleznev, ulitsa B.Dorogomilovskaya, 25, kv. 65, all of Moscow, U.S.S.R.

[21] Appl. No.: 800,908

[22] Filed: May 26, 1977

[51] Int. Cl.$^2$ ............................................. G11C 13/04
[52] U.S. Cl. ..................................... 365/125; 365/120
[58] Field of Search ................ 340/173 LT, 173 LM, 340/173 LS; 365/120, 121, 122, 125, 127

[56] References Cited
U.S. PATENT DOCUMENTS 3,767,285  10/1973  Mezrich ..................... 340/173 LM
3,787,823  1/1974   Negishi ..................... 340/173 LS Primary Examiner—Terrell W. Fears
Attorney, Agent, or Firm—Haseltine, Lake & Waters

[57] ABSTRACT

An optoelectronic memory comprising the following elements placed one after another in succession downstream the original beam from the source of electromagnetic radiation: a means for scanning the original beam, which is electrically connected to an address register, a means for splitting the original beam into m beams forming a scan pattern and a focusing lens. The focusing lens is followed by n beam splitters whose number along each beam direction is equal. The memory also comprises |n+1| information memory plates each being positioned at a focal distance from the focusing lens and carrying m memory modules arranged upon the surface facing the beam. The memory modules are made as multilayer structures comprising the following elements placed downstream the beam: a transparent electrode electrically connected to the output of an information recording register, layers of at least two dielectrics and a semiconductor and an electrode electrically connected to the input of the information readout register.

2 Claims, 2 Drawing Figures

OPTOELECTRONIC MEMORY

This invention relates to computing machinery and, in particular, to optoelectronic memories.

This invention can be successfully employed for storage and prompt readout of large data files in electronic computers and information retreaval systems.

The steadily increasing information flow and the growing complexity of scientific and economic problems require an ever increasing volume of the memory and the speed of action of electronic computers.

In the known optoelectronic memories insufficient sensitivity of the storage mediums, as well as the time lag of control elements restrict potentialities for increase of the memory volume and storage speed.

There is known an optoelectronic memory comprising several elements positioned successively one after another downstream the original beam from the source of electromagnetic radiation: a means for scanning of the original beam, which is electrically connected to an address register, a means for splitting the original beam into m beams forming a scan pattern and a focusing lens, as well as n beam splitters located after the focusing lens, whose number along each direction of the beams is equal and (n+1) information memory plates each being placed at a focal distance from the focusing lens and having m memory modules arranged upon the surface facing the beams and made as a multilayer structure, each being electrically connected to an information recording register and to an information readout register. Besides, this memory comprises m coils in order to produce a magnetic field applied to the memory modules connected to the outputs of the information recording register and m photoelectric cells arranged downstream the beam after memory modules and electrically connected to the inputs of the information readout register.

The presence of coils in the known memory, whose inductance depends upon the information pacacity of the memory modules, results in increase of edges and the duration of the control pulse which limits the storage speed and the information capacity of said memory.

The presence of m separate photoelectric cells in the known memory it more complicated and expensive.

Besides, in the known memory the multilayer structure comprises a layer of a photoconductor provided with electrodes coupled to electric pulse shapers which makes said memory more complex and results in greater power consumed, whereas the time lag of the photoconductor layer limits the storage speed of the memory modules.

An object of this invention is to increase the storage speed of the optoelectronic memory.

Another object of this invention is to make the optoelectronic memory simplier and cheaper.

Yet another object of this invention is to increase the information capacity of the optoelectronic memory.

This is achieved by that in an optoelectronic memory comprising several elements placed one after another downstream the original beam from the source of electromagnetic radiation; such as a means for scanning the original beam, which is electrically connected to an address register, a means for splitting the original beam into m beams forming a scan pattern and a focusing lens, as well as comprising n beam splitters located after the focusing lens, whose number along each beam is equal, and $|n+1|$ information memory plates each being placed at a focal distance from the focusing lens and having m memory modules arranged on the surface facing the beams and made as a multilayer structure, each being electrically connected to an information recording register and an information readout register, according to the invention, the multilayer structure comprises a transparent electrode connected to the output of the information recording register, layers of at least two dielectrics and a semiconductor and an electrode connected to the input of the information readout register, all being placed downstream the beams.

This invention ensures storage and prompt readout of large data files.

Besides, this invention permits production of a simplier and cheaper optoelectronic memory.

Other objects and advantages of the present invention will become more apparent from the following detailed description of preferred embodiments thereof, taken in conjunction with the accompanying drawings, wherein.

Figure 1:
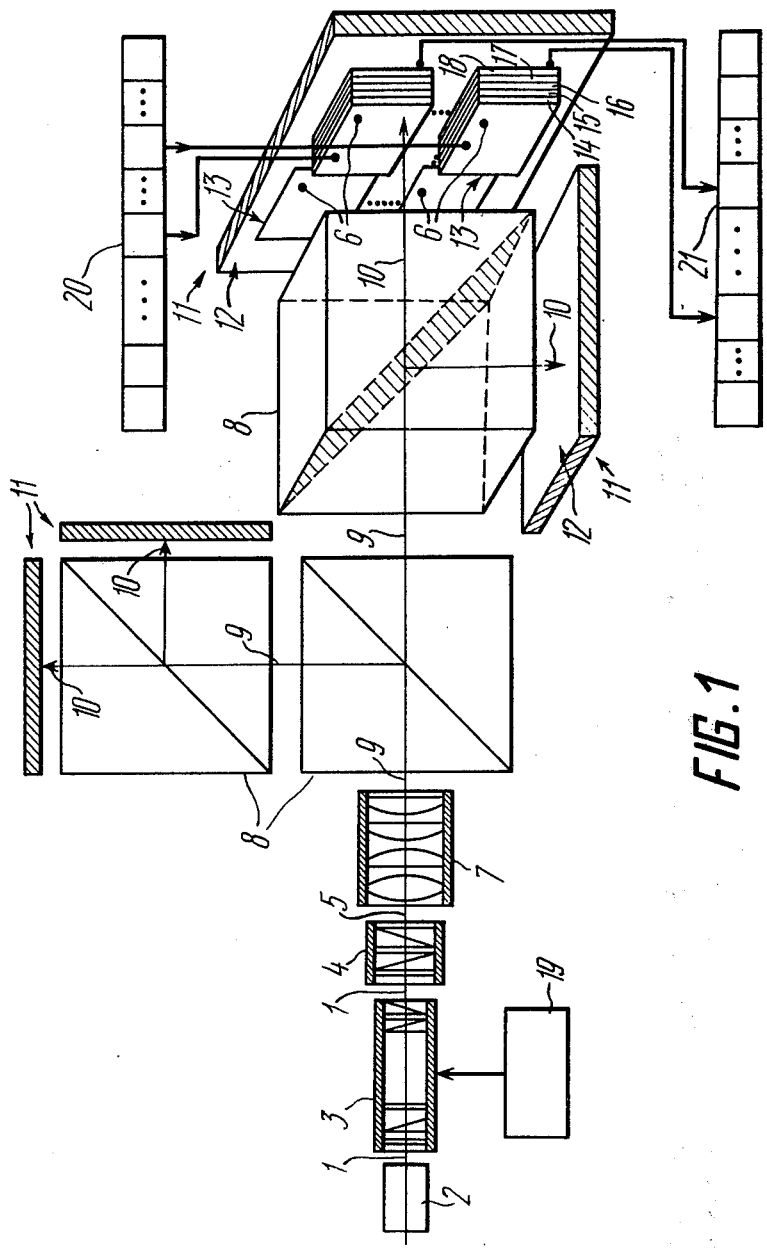
FIG. 1 shows a functional diagram of an optoelectronic memory, according to the invention.

An optoelectronic memory comprises, positioned successively one after another along an original beam 1 (FIG. 1) from a source 2 of electromagnetic radiation, a means 3 for scanning the original beam 1, a means 4 for splitting the original beam 1 into m beams 5 forming a scan pattern 6 and a focusing lens 7. The focusing lens 7 is followed by n beam splitters 8 whose number along each direction of beams 9 is uniform. $|n + 1|$ information memory plates 11 are placed at a focal distance from the focusing lens 7 across beams 10 from the beam splitters 8. Located on a surface 12 of the plate 11 facing the beam 10 are m memory modules 13. The modules 13 are made as a multilayer structure which comprises, arranged successively one after another along the beam 10, a transparent electrode 14, two dielectric layers 15 and 16, a semiconductor layer 17 and an electrode 18. An address register 19 is connected to the means 3 for scanning the original beam 1. The transparent electrode 14 and the electrode 18 of each memory module 13 are coupled to the homopolar registers of an information recording register 20 and an information readout register 21, respectively.

Figure 2:
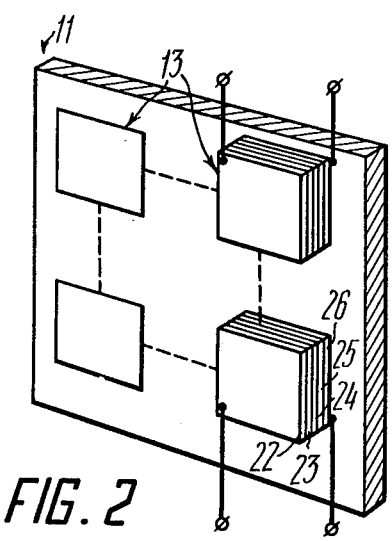
FIG. 2 shows an embodiment of memory modules whose multilayer structure has another sequence of layers, according to the invention.

In conformity with another embodiment of the memory modules 13 (FIG. 2) their multilayer structure is composed of a transparent electrode 22, a dielectric layer 23, a semiconductor layer 24, a dielectric layer 25 and an electrode 26, which are arranged one after another.

In conformity with another embodiment of memory modules (the drawing is not provided, since it is similar to FIG. 2) their multilayer structure comprises a transparent electrode, a semiconductor layer, two layers of dielectrics and an electrode, which are arranged one after another.

The memory operates as follows.

When selecting information, the original beam 1 (FIG. 1) from the source 2 of electromagnetic radiation (when laser is used, it is a beam of light) is deflected by the means 3 for scanning the original beam 1 into one of the positions and in conformity with the code set in the address register 19. For each position of the beam 1 the means 4 for splitting the original beam 1 produces m beams 5 at its output, which go to the focusing lens 7. Placed after the focusing lens 7 n beam splitters 8 split m beams 5 into |n+1| scan patterns 6 and direct them to the surfaces 12 of |n+1| memory plates 11. The plates 11 are located at a focal distance from the lens 7, where all beams 10 are focused into spots with a diameter of several microns. Each of the memory plates 11 comprises m memory modules 13, each receiving one beam from the scan pattern 6.

According to the invention, the light beam 10 passes the transparent electrode 14, the layers 15 and 16 of dielectric and is absorbed in the semiconductor layer 17. The light beam 10 passes through the dielectric layers 15 and 16 without being absorbed. In case the semiconductor layer 24 (FIG. 2) is positioned between the dielectric layers 23 and 25, the beam 10 (FIG. 1) passes the transparent electrode 22 (FIG. 2), the first dielectric layer 23 and is absorbed in the semiconductor layer 24. That is why the operation of the memory can be seen from FIG. 1. The semiconductor layer 17 (FIG. 1) ensures high sensitivity to light of the multilayer structure of the module 13.

When information is recorded (recording of a unit) in the module 13, the light beam 10 coming to the transparent electrode 14 from the information recording register 20 is accompanied by a negative voltage pulse having a value over the threshold value.

This control voltage separates electron-hole pairs in the lighted portions of the multilayer structure of the module 13 by an electric field, whereas excess charge carriers are accumulated on the boundary between the layers 16 and 17 (dielectric-semiconductor), which results in redistribution of voltage between all layers of the structure. In the lighted portions of the multilayer structure of the module 13 the voltage increases in the dielectric layers 15 and 16, which results in capture of a part of charge carriers by the dielectric traps. Charge capture by the dielectric traps ensures long-time storage of information.

Erasing information (zero recording) is done similarly to recording with a different polarity of the control voltage. For this purpose a positive voltage pulse is fed to the transparent electrode 14 from the information recording register 22 and it ensures erasing of information.

The captured charge produces in the semiconductor layer 17 an electric field. Under the action of this field the surface curve of zones within the semiconductor layer 17 is changed and, consequently, when this portion is lighted by the beam 10, a corresponding photoelectric signal is produced, which is employed for readout of information. For this purpose a negative voltage pulse is supplied to the transparent electrode 14 of each module 13, its value being under the threshold value. The electrode 18 of each module 13 connected to one of the inputs of the information readout register 21 produces an output signal corresponding to the recorded information in the spot where the beam 10 is applied.

When the modules 13 are made as the disclosed multilayer structure, connected and arranged as described above, this ensures a simplier memory characterized by greater storage speed and information capacity.

What is claimed is:

1. An optoelectronic memory comprising:
   a source of electromagnetic radiation, producing an original beam;
   a means for scanning said original beam, placed along said original beam after said source of electromagnetic radiation and having an input;
   an address register having an output electrically connected to said input of said means for scanning of said original beam;
   a means for splitting said original beam into m beams forming a scan pattern, placed along said original beam after said means for scanning said original beam;
   a focusing lens placed along said original beam after said means for splitting said original beam;
   n beam splitters placed after said focusing lens along each said m beams and splitting each said beam into two beams;
   said beam splitters placed along each direction of said beams so that in the direction of each said beam their number is uniform;
   |n+1| information memory plates, each being placed at a focal distance from said focusing lens after the last of said beam splitters along said beam and having one of its surfaces facing said beam;
   m memory modules, each being made as a multilayer structure and being arranged on said surfaces of said information memory plates;
   said multilayer structure comprising, arranged along said beam, a first transparent electrode, next layers selected in a specified combination from a group containing at least two dielectrics and a semiconductor, and a second electrode;
   an information recording register electrically connected to said first transparent electrode;
   an information readout register electrically connected to said second electrode.

2. An optoelectronic memory as defined in claim 1 wherein light passing said transparent electrode is absorbed in said semiconductor layer, said light being free from absorption by said dielectric layers, said semiconductor layer having substantially high sensitivity to light of the multilayer structure, said light transmitted by said transparent electrode having a negative voltage pulse over a predetermined threshold value from said information recording register.

* * * * *